(12) United States Patent
Nakamura et al.

(10) Patent No.: US 7,285,776 B2
(45) Date of Patent: Oct. 23, 2007

(54) SCANNING TRANSMISSION ELECTRON MICROSCOPE AND ELECTRON ENERGY LOSS SPECTROSCOPY

(75) Inventors: Kuniyasu Nakamura, Musashino (JP); Shunichi Watanabe, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 294 days.

(21) Appl. No.: 11/157,817

(22) Filed: Jun. 22, 2005

(65) Prior Publication Data
US 2005/0285037 A1    Dec. 29, 2005

(30) Foreign Application Priority Data
Jun. 25, 2004    (JP)    ............................. 2004-187570

(51) Int. Cl.
*G01N 23/00*    (2006.01)

(52) U.S. Cl. ........................ 250/305; 250/311; 250/310

(58) Field of Classification Search .................... None
See application file for complete search history.

(56) References Cited

FOREIGN PATENT DOCUMENTS

| JP | 11-250850 | 9/1999 |
|---|---|---|
| JP | 2001-266783 | 9/2001 |

*Primary Examiner*—Jack I. Berman
*Assistant Examiner*—Zia R. Hashmi
(74) *Attorney, Agent, or Firm*—Antonelli, Terry, Stout & Kraus, LLP.

(57) ABSTRACT

The present invention provides a scanning transmission electron microscope which is capable of setting an acceptance angular range of an energy loss spectrometer independent of an acceptance angular range of a scattered electron detector, and makes it unnecessary to change a condition for the energy loss spectrometer with respect to a change in the acceptance angular range of the scattered electron detector. In such a scanning transmission electron microscope equipped with the energy loss spectrometer, a first rotationally symmetric type magnetic lens for setting an acceptance angle of an electron scattered by a specimen is disposed above the scattered electron detector for detecting the electron, a second rotationally symmetric type magnetic lens is disposed between the scattered electron detector and the energy loss spectrometer, the first rotationally symmetric type magnetic lens sets the acceptance angle of the scattered electron, and the second rotationally symmetric type magnetic lens sets an object point of the energy loss spectrometer.

16 Claims, 8 Drawing Sheets

SCANNING TRANSMISSION ELECTRON MICROSCOPE AND ELECTRON ENERGY LOSS SPECTROSCOPY

CLAIM OF PRIORITY

The present invention claims priority from Japanese application JP 2004-187570 filed on Jun. 25, 2004, the content of which is hereby incorporated by reference to this application.

BACKGROUND OF THE INVENTION

The present invention relates to a scanning transmission electron microscope equipped with an energy loss spectrometer, and an electron energy loss spectroscopy using the same.

A scanning transmission electron microscope provided with an energy loss spectrometer detects each electron scattered by a specimen or transmitted through the specimen in synchronization with the scanning of an electron probe to thereby bring an intensity distribution of the scattered electron or transmitted electron into an image, and simultaneously detects an energy loss spectrum or an intensity distribution of a specific energy-selected electron in synchronization with the scanning of the electron probe by use of some of the transmitted and scattered electrons to thereby bring the intensity distribution of the energy-selected electron into image form.

A method for acquiring a scattered electron image using the conventional scanning transmission electron microscope apparatus, a method for acquiring an energy loss spectrum, and a method for acquiring an element mapping image using an energy loss spectrum have been disclosed in, for example, Japanese Patent Application Laid-Open No. 2001-266783. According to each of the methods, a scattered electron intensity is detected by an annular shaped scintillator having an aperture or opening in its center, which is used as a scattered electron detector, and is brought into image form. Then, an electron or electron beam transmitted through the opening is launched into an energy loss spectrometer, where an energy loss spectrum and an element mapping image using an energy loss spectrum are acquired.

Angular ranges of the scattered electron and the electron captured into the energy loss spectrometer are controlled by a projector lens disposed above the scattered electron detector. An image point of the projector lens corresponds to an object point of the energy loss spectrometer. The energy loss spectrometer has an object point thereof and a design value of an acceptance or capturing physical angle necessary to obtain a well resolved spectrum. The object point is set by the above methods and the setting of the physical angle corresponding to the above setting is carried out by inserting a collection angle defining aperture directly above the energy loss spectrometer. A detecting angle of the scattered electron is decided at the position of the object point of the projector lens with respect to the above condition. Positions, regions and the like for acquiring the energy loss spectrum and the element mapping image can be determined while the scattered electron image is being observed. The energy loss spectrometer forms an energy dispersion corresponding to an energy loss of the electron by use of a magnetic field prism and enlarges the focus and energy dispersion width of a spectrum by means of a multi-pole element. While the object point of the energy loss spectrometer corresponds to an image point at which the magnetic field prism is capable of forming a satisfactory dispersion, it normally has an allowable range of about 50 mm. The allowable range of the object point is decided based on an allowable range of aberration of the magnetic field prism and an allowable range in which the focus of the spectrum can be formed by the multi-pole element. Upon setting of an actual optical condition, the condition of the projector lens is determined while the S/N of a scattered electron image, the S/N of an energy loss spectrum, and an energy resolution are being measured.

SUMMARY OF THE INVENTION

In the above methods for acquiring the scattered electron image, the energy loss spectrum and the element mapping image using the energy loss spectrum, using the conventional scanning transmission electron microscope, there may be cases where when the condition under which a satisfactory spectrum can be acquired, is decided as the condition for the projector lens, the optimum acceptance angular range of the scattered electron image cannot be set depending upon the distance between the scattered electron detector and the energy loss spectrometer and the shape and size of the scattered electron detector, so that the scattered electron image, energy loss spectrum and element mapping image cannot be obtained simultaneously. When the projector lens is set to the optimum acceptance angular range of the scattered electron image in reverse, the object point with respect to the energy loss spectrometer might not be formed. Even when the projector lens is set to the optimum acceptance angular range of the scattered electron image and the object point with respect to the energy loss spectrometer can be formed, there is a possibility that the amount of electrons passing through the collection angle defining aperture will decrease where the setting of the physical angle with respect to the energy loss spectrometer is done by the collection angle defining aperture. Thus, the S/Ns of the energy loss spectrum and element mapping image might be reduced.

Theoretically, in order to set the scattered electron image and the energy loss spectrum to the optimum electron acceptance angular ranges respectively, the distance between the scattered electron detector and the energy loss spectrometer is reduced and the ratio between the diameter of the aperture of the scattered electron detector and the diameter of the collection angle defining aperture is caused to approach 1, whereby the foregoing problems can be lightened up. However, the distance between the scattered electron detector and the energy loss spectrometer cannot be reduced to be short enough to enable the solution of the above problems due to a problem about mounting spaces for multi-stage multi-pole elements constituting the energy loss spectrometer, a drive mechanism of the collection angle defining aperture, the scattered electron detector and the transmitted electron detector. The capturing or acceptance physical angle of the energy loss spectrometer is restricted to about 1 mrad to reduce the aberration of the energy loss spectrometer. Assuming that the distance of an object point is 500 mm and the acceptance physical angle of the energy loss spectrometer is 1 mrad, the radius of the collection angle defining aperture results in 0.5 mm. The aperture of the scattered electron detector takes a shape provided such that a pipe for ensuring an electron-transmitted portion penetrates a scintillator and a light guide. Although the length of the pipe depends on the diameter of the scintillator, it is normally approximately 10 mm. Thus, there is a need to vertically penetrate a pipe having an aspect ratio 10 into the scattered electron detector. The degradation of yields due to the difficulty of fabricating the scattered electron detector occurs. There is also a possibility that when the present pipe is inclined a few degrees, an electron is reflected or absorbed by the pipe so that a sufficient intensity cannot be launched into the energy loss spectrometer. Thus, bringing the ratio between the diameter of the aperture of the scattered electron detector and the diameter of the collection angle defining aperture close to 1 encounters technical difficulties, its feasibility is low.

As described above, the conditions for the projector lenses each capable of setting the optimum detecting angle with respect to the scattered electron to obtain the scattered electron image and setting the object point of the energy loss spectrometer and the acceptance physical angle of the energy loss spectrometer both necessary to obtain the satisfactory spectrum, and embodiments of various detectors and loss spectrometers are greatly restricted and not necessarily suitable for the image and the S/N of the spectrum.

In order to solve the above, a scanning transmission electron microscope is needed which is capable of independently carrying out the setting of the optimum detecting angle with respect to a scattered electron, and the setting of an object point of an energy loss spectrometer and an acceptance physical angle thereof both necessary to obtain a satisfactory spectrum.

With the foregoing in view, an object of the present invention is to provide a scanning transmission electron microscope which is capable of setting an acceptance angular range of an energy loss spectrometer independent of the setting of an acceptance angular range of a scattered electron detector and which needs not to change the condition for the energy loss spectrometer with respect to a change in the acceptance angular range of the scattered electron detector, and to provide an electron energy loss spectroscopy using the scanning transmission electron microscope.

In order to attain the above object, the present invention is provided wherein a first rotationally symmetric type magnetic lens for setting an acceptance angle of a scattered electron is disposed above a scattered electron detector, and a second rotationally symmetric type magnetic lens is disposed between the scattered electron detector and the energy loss spectrometer, and wherein the first rotationally symmetric type magnetic lens sets the acceptance angle of the scattered electron and the second rotationally symmetric type magnetic lens sets an object point of the energy loss spectrometer.

That is, the present invention provides a scanning transmission electron microscope which carries out the acquisition of a scattered electron image, a transmitted electron image, an energy loss spectrum and an element mapping image using the energy loss spectrum. In the scanning transmission electron microscope, a first rotationally symmetric type magnetic lens of at least one stage for setting an acceptance angle of the scattered electron is disposed above the scattered electron detector. A second rotationally symmetric type magnetic lens of at least one stage is disposed between the scattered electron detector and the energy loss spectrometer. A transmitted electron detector is placed below its corresponding rotationally symmetric type magnetic lens subsequent to at least the first stage, of the one or more second rotationally symmetric type magnetic lenses each disposed between the scattered electron detector and the energy loss spectrometer, and a collection angle defining aperture is disposed directly above the energy loss spectrometer. Consequentially, the acceptance angle of each scattered electron is set by the first rotationally symmetric type magnetic lens of at least one stage disposed above the scattered electron detector. An object point of the energy loss spectrometer is set by the second rotationally symmetric type magnetic lens of at least one stage disposed between the scattered electron detector and the energy loss spectrometer. An acceptance physical angle of the energy loss spectrometer is set by the collection angle defining aperture disposed directly above the energy loss spectrometer. An acceptance angular range of the transmitted electron detector is set by the second rotationally symmetric type magnetic lens of at least one stage disposed between the scattered electron detector and the collection angle defining aperture of the energy loss spectrometer.

According to the present invention, a scanning transmission electron microscope can be realized which is capable of setting an acceptance angular range of an energy loss spectrometer independent of the setting of an acceptance angular range of a scattered electron detector and which needs not to change the condition for the energy loss spectrometer with respect to a change in the acceptance angular range of the scattered electron detector, and an electron energy loss spectroscopy using the scanning transmission electron microscope can be realized.

DETAILED DESCRIPTION OF THE PREFERRED EMBODIMENTS

Preferred embodiments of the present invention will hereinafter be described in detail with reference to the accompanying drawings.

A configuration of an apparatus for independently carrying out the setting of an optimum detecting angle with respect to a scattered electron or electron beam, and the setting of an object point of an energy loss spectrometer and an acceptance physical angle thereof necessary to obtain a satisfactory spectrum, and electron optical conditions will be explained below using a scanning transmission electron microscope.

Figure 1:
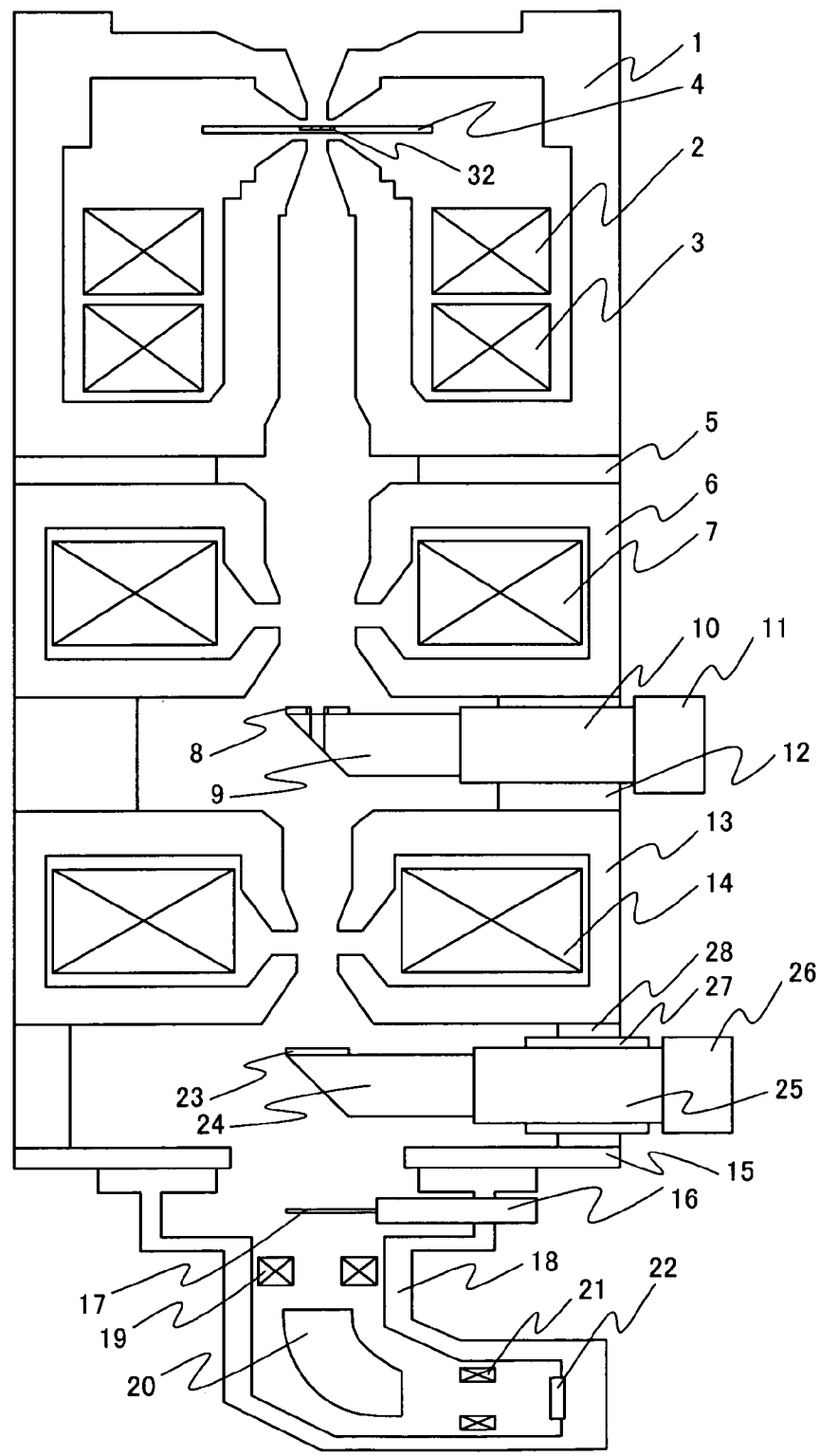
FIG. 1 is a diagram for describing a configuration example of a scanning transmission electron microscope according to the present invention.

FIG. 1 shows a configuration related to an imaging system of the scanning transmission electron microscope according to the present invention. An objective lens upper coil 2 and an objective lens lower coil 3 are placed inside an objective lens 1. A specimen 32 is held by a specimen holder (or specimen table) 4 is disposed in a lens gap. A first stage projector lens of a rotationally symmetric type (magnetic lens) 6 and a first stage projector lens coil 7 thereof are provided below a spacer 5 with the spacer 5 interposed between the objective lens 1 and the two projector lenses. A scattered electron detector (dark field detector) is mounted to a mounting flange of scattered electron detector 12 disposed therebelow. An electron or electron beam scattered by the specimen 32 is converted to light by an annular-shaped scintillator of scattered electron detector 8, which in turn is introduced into a photo multiplier tube of scattered electron detector 10 by a light guide of scattered electron detector 9, after which the light is converted into a voltage signal amplified by an amplifier of scattered electron detector 11. The voltage signal is A/D converted to cause it to have gradation such as 16 bits. Then, the gradation is displayed on the screen of a computer in synchronization with the scanning of an electron probe on the specimen 32, or the voltage signal is displayed on a CRT monitor in synchronization with the scanning of the electron probe to thereby obtain a scattered electron image (dark field image).

A second stage projector lens 13 of a rotationally symmetric type (magnetic lens) and a second stage projector lens coil 14 thereof are disposed below the mounting flange of scattered electron detector 12. Further, a mounting flange of transmitted electron detector 28 is provided therebelow. The transmitted electron detector (bright field detector) comprises a scintillator of transmitted electron detector 23, a light guide of transmitted electron detector 24, a photo multiplier tube of transmitted electron detector 25, and an amplifier of transmitted electron detector 26 in a manner similar to the scattered electron detector. A transmitted electron image (bright field image) is displayed on the computer or CRT in accordance with the same format as the formation of the scattered electron image. A drive mechanics for transmitted electron detector 27 is used for the purpose of pulling out the transmitted electron detector from an optical axis when the energy loss spectrometer is used, and is controlled by air pressure or a mechanical moving mechanism or the like. A mounting flange of energy loss spectrometer 15 is disposed below the mounting flange of transmitted electron detector 28, and the energy loss spectrometer 18 is attached to its corresponding portion disposed therebelow. A collection angle defining aperture of energy loss spectrometer 17 for restricting or defining a physical angle of an electron or electron beam incident on the energy loss spectrometer 18 is disposed above the energy loss spectrometer 18. The collection angle defining aperture, i.e., about four opening circular holes different in aperture diameter can be selected by a drive mechanics for collection angle defining aperture of energy loss spectrometer 16 or can perfectly be pulled out from the optical axis. The drive mechanics 16 is controlled by air pressure or mechanical moving mechanism or the like.

A mode switching input means for selecting a dark field image observation mode, a bright field image observation mode or a mode for simultaneously observing a dark field image and a bright field image is provided. A control means for controlling a detector drive means including the drive mechanics for transmitted electron detector 27 operates the detector drive means in accordance with an input to the mode switching input means to enable the transmitted electron detector to be withdrawn from on the optical axis or move onto the optical axis.

The energy loss spectrometer 18 comprises a multi-pole lens of energy loss spectrometer for forming energy spectrum 19, a magnetic prism of energy loss spectrometer for magnifying energy dispersion 20, a multi-pole lens of energy loss spectrometer for magnifying energy dispersion 21, and a spectrum detector of energy loss spectrometer 22. The magnetic prism of energy loss spectrometer for forming energy dispersion 20 is a prism for dispersing energy of an electron or electron beam transmitted through the specimen 32 and is formed of magnetic poles and a magnetic field coil. The multi-pole lens of energy loss spectrometer for forming energy spectrum 19 and the multi-pole lens of energy loss spectrometer for magnifying energy dispersion 21 provided in the energy loss spectrometer 18 are configured in such a manner that quadrupoles, sextupoles, octupoles, decupoles, etc. are combined or bonded in multistage form, and has the function of focusing an energy loss spectrum on the spectrum detector of energy loss spectrometer 22, rotating, enlarging or reducing it with respect to the spectrum detector of energy loss spectrometer 22.

Figure 2:
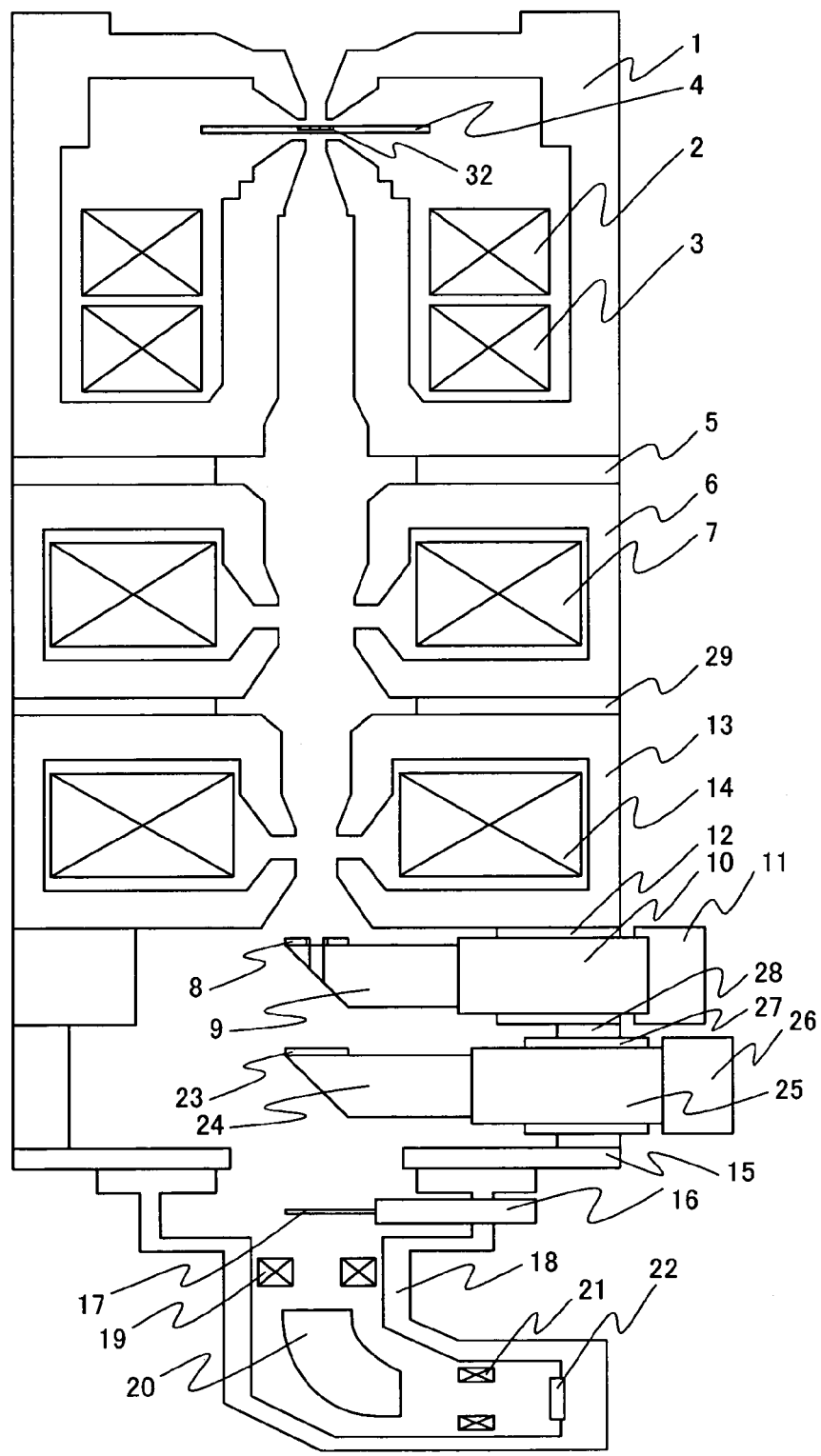
FIG. 2 is a diagram for explaining a configuration of a conventional scanning transmission electron microscope.

FIG. 2 shows a configuration diagram related to an imaging system of a conventional scanning transmission electron microscope to make contrast with the present invention. From the above point of view, it comprises an objective lens 1, a first stage projector lens of a rotationally symmetric type 6, a spacer 29, a second stage projector lens of a rotationally symmetric type 13, a mounting flange of scattered electron detector 12, a mounting flange of transmitted electron detector 28, a mounting flange of energy loss spectrometer 15, and an energy loss spectrometer 18. Detailed configurations and functions of the respective portions are similar to the scanning transmission electron microscope of the present invention shown in FIG. 1. The image points are sequentially formed by the lenses such as the objective lens 1, the first stage projector lens of the rotationally symmetric type 6 and the second stage projector lens of the rotationally symmetric type 13. The image point formed by the rotationally symmetric type lens at the lowermost stage is equivalent to an object point of the energy loss spectrometer 18. Acceptance angles of the scattered electron detector, transmitted electron detector and energy loss spectrometer are determined by a single combination depending upon positions and sizes of the respective detectors.

A method for calculating, using the scanning transmission electron microscope, imaging optical conditions for acquiring a scattered electron image and an energy loss spectrum, and an angular range of an electron or electron beam taken in the scattered electron detector and the energy loss spectrometer will next be explained.

Figure 3:
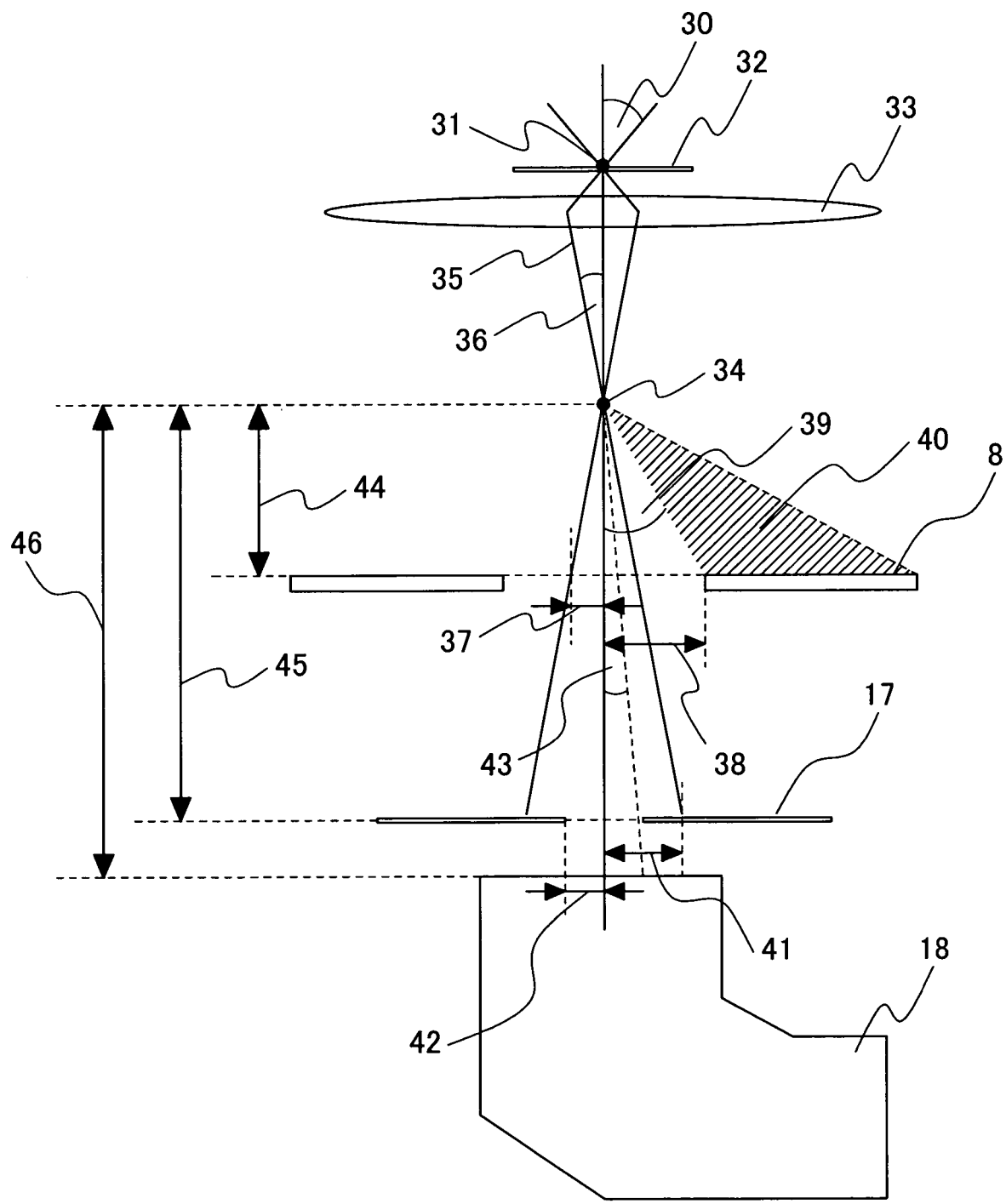
FIG. 3 is a diagram for describing a method for calculating an angular range for acceptance of an electron into a scattered electron detector and an energy loss spectrometer.

FIG. 3 shows the conditions that an electron or electron beam transmitted through a specimen 32 forms an image point 34 of an imaging lens 33 through the imaging lens 33, the electron scattered by the specimen 32 is detected by the scattered electron detector, and the electron beam transmitted through the center of the annular-shaped type scattered electron is detected by the energy loss spectrometer.

In the present figure, the imaging lens 33 contains the objective lens and a plurality of stages of projector lenses disposed in a stage placed therebelow and is expressed as one lens with their lens actions taken together. Also the present drawing shows the case in which the scattered electron detector and the energy loss spectrometer are disposed below the imaging lens 33. It is assumed that no rotationally symmetric lens is contained between the scattered electron detector and the energy loss spectrometer. Assume that an electron probe forms an electron spot image 31 to be placed on the surface of the specimen 32, on the specimen 32 at a convergence angle of incident electron 30, and the electron spot image 31 is focused on its corresponding image point 34 of the imaging lens by the imaging lens 33.

Now assuming that the convergence angle of incident electron 30 is α and an emerging angle of imaging lens 36 is θ, a relational expression is obtained as follows:

$$M = \alpha/\theta \quad \text{(equation 1)}$$

Thus, a magnification M of the imaging lens 33 is defined by this relational equation. That is, M indicates a magnification based on an integrated lens action of the objective lens 1, the first stage projector lens 6 and the second stage projector lens 13 in the embodiment shown in FIG. 1.

An axial ray 35 is plotted by connecting visible outlines relative to the convergence angle of incident electron 30 in such a manner that the visible outlines pass through the electron spot image 31 placed on the surface of the specimen and the image point 34 of the imaging lens and their directions change in the center of the imaging lens 33. Since the axial ray 35 causes no change in orbit in a space free of the rotationally symmetric lens, the axial ray is plotted in a region below the image point 34 by causing the visible outlines at the image point 34 of the imaging lens to extend.

Thus, assuming that an axial ray 37 at the scattered electron detector is r(DF), an axial ray 41 at the collection angle defining aperture of energy loss spectrometer is r(EL), a distance 44 between the scattered electron detector and the image point of the imaging lens is L(DF), and a distance 45 between the collection angle defining aperture of energy loss spectrometer and the image point of the imaging lens is L(EL), the following relational expressions are established:

$$r(DF) = L(DF) \cdot \theta \quad \text{(equation 2)}$$

$$r(EL) = L(EL) \cdot \theta \quad \text{(equation 3)}$$

Also assuming that the radius 38 of the scattered electron detector is R(DF), the radius 42 of the collection angle defining aperture of energy loss spectrometer is R(EL), the physical angle 39 corresponding to the radius of scattered electron detector with respect to the image point 34 of imaging lens is γ, and the physical angle 43 corresponding to the radius of collection angle defining aperture of energy loss spectrometer with respect to the image point 34 of imaging lens is β, the following relational expressions are established:

$$\gamma = R(DF)/L(DF) \quad \text{(equation 4)}$$

$$\beta = R(EL)/L(EL) \quad \text{(equation 5)}$$

On the other hand, since an acceptance angle γ' of the scattered electron detector, and an acceptance angle β' of the energy loss spectrometer are values obtained by converting the ratios between the axial arrays at the scattered electron detector and the energy loss spectrometer and the radii thereof into image surfaces respectively, the following relational expressions are established:

$$\gamma' = R(DF)/r(DF) \cdot \alpha = M \cdot \gamma \quad \text{(equation 6)}$$

$$\beta' = R(EL)/r(EL) \cdot \alpha = M \cdot \beta \quad \text{(equation 7)}$$

That is, the acceptance angles of the scattered electron detector and the energy loss spectrometer are decided depending upon the magnification M of the imaging lens 33 and the position of the image point 34 of the imaging lens, which are determined according to the conditions of the imaging lens. However, a detecting angle 40 of the scattered electron detector corresponds to an angular range from the outside of the radius 38 of the scattered electron detector to the outer periphery of the scintillator 8 of the scattered electron detector. γ' indicates an inner angle of the detection angle of the scattered electron detector. Assuming that an S/N of an energy loss spectrum depends on the acceptance angle of the energy loss spectrometer, and the ratio thereof to the convergence angle α of the incident electron is an energy loss spectrum detection efficiency Reff, the following relational expression is established:

$$\text{Reff} = \beta'/\alpha = M \cdot \beta/\alpha \quad \text{(equation 8)}$$

It is understood here that as conditions for obtaining a satisfactory energy loss spectrum, a distance 46 of the object point from the energy loss spectrometer and a physical angle 43 corresponding to the radius of the collection angle defining aperture of the energy loss spectrometer with respect to the image point of the imaging lens are restricted in magnitude to realize an energy resolution of the spectrum, and the energy loss spectrum detection efficiency is decided according to the magnification M of the imaging lens 33 if β is used as a fixed value.

A condition for causing the energy loss spectrometer to accept all the incident electrons is expressed in the following equation:

$$\beta \geq \alpha/M \quad \text{(equation 9)}$$

A condition for detecting only some portion of the incident electrons is given as follows:

$$\beta \leq \alpha/M \quad \text{(equation 10)}$$

Due to reasons concerned with the mounting of the scattered electron detector and the energy loss spectrometer and the matching between the acceptance angular range of the scattered electron detector and the acceptance angular range of the energy loss spectrometer, the condition expressed in (equation 9) cannot be always used in the acquisition of the energy loss spectrum using the conventional scanning transmission electron microscope. Therefore, there were often cases in which the energy loss spectrum of high in S/N could not be captured.

On the other hand, assuming that in the imaging optical system of the present invention, the magnification of the imaging lens disposed above the scattered electron detector is M1 and the magnification of at least one stage rotationally symmetric lens provided between the scattered electron detector and the collection angle defining aperture of the energy loss spectrometer is M2, an acceptance angle γ' of the scattered electron detector, an acceptance angle β' of the energy loss spectrometer, and an energy loss spectrum detection efficiency Reff are respectively given as follows:

$$\gamma' = M1 \cdot \gamma \quad \text{(equation 11)}$$

$$\beta' = M1 \cdot M2 \cdot \beta \quad \text{(equation 12)}$$

$$\text{Reff} = M1 \cdot M2 \cdot \beta/\alpha \quad \text{(equation 13)}$$

That is, the acceptance angular range (detecting angle) of the scattered electron detector can be set by the imaging lens disposed in the stage above the scattered electron detector.

The acceptance angular range (detecting angle) of the energy loss spectrometer can independently be set by at least one stage rotationally symmetric lens provided between the scattered electron detector and the collection angle defining aperture of the energy loss spectrometer. If such an imaging optical system is used, then the acquisition of the scattered electron image satisfactory in S/N, and the acquisition of the energy loss spectrum satisfactory in S/N and energy resolution are simultaneously enabled.

The acceptance angular ranges for the scattered electron image and the energy loss spectrum by use of the conventional scanning transmission electron microscope will next be explained for the purpose of comparison with the present invention.

Figure 4:
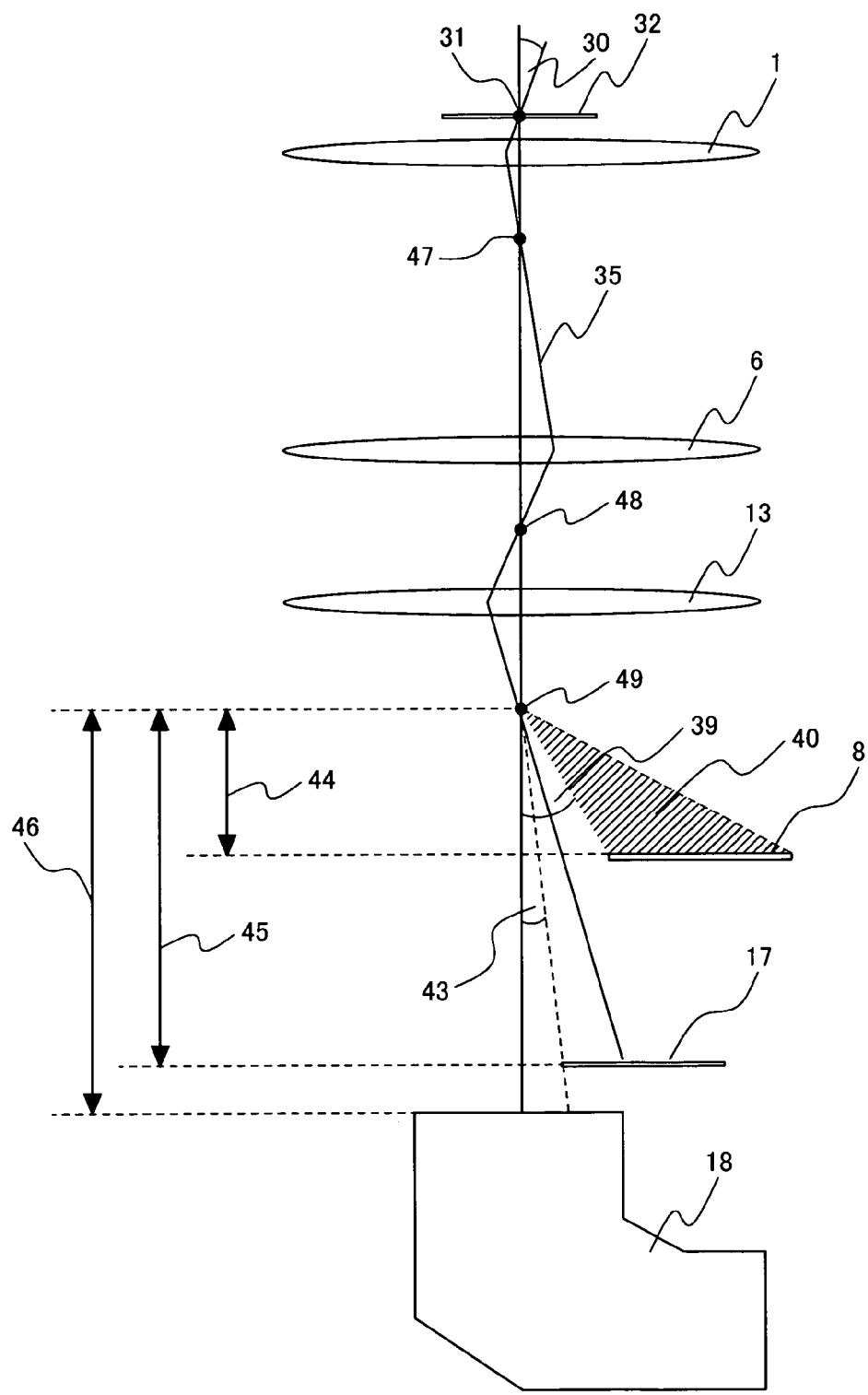
FIG. 4 is a diagram for describing an angular range for acceptance of an electron into the scattered electron detector and the energy loss spectrometer by the conventional scanning transmission electron microscope.

FIG. 4 shows electron optical conditions where an image point 47 of an objective lens 1, an image point 48 of a first stage projector lens 6, an image point 49 of a second stage projector lens 13 are respectively sequentially formed by the objective lens 1, the first stage projector lens 6 and the second stage projector lens 13. Assuming that a distance 46 of an object point from the energy loss spectrometer and a physical angle 43 corresponding to the radius of the collection angle defining aperture of the energy loss spectrometer with respect to the image point of the imaging lens are set on the condition that a spectrum having a satisfactory energy resolution is obtained using the energy loss spectrometer 18, there is a possibility that since the outside of an incident electron transmitted through the scintillator 8 of the scattered electron detector is cut by the collection angle defining aperture 17 of the energy loss spectrometer, an energy loss spectrum will not be obtained with a sufficient S/N.

On the contrary, even when the incident electron is caused to pass through the collection angle defining aperture 17 of the energy loss spectrometer and the physical angle 43 corresponding to the radius of the collection angle defining aperture of the energy loss spectrometer with respect to the optimum image point of the imaging lens can be set, there is a possibility that an S/N of the scattered electron image cannot sufficiently be obtained where the image point 49 of the second stage projector lens is not able to match with the acceptance angular range of the scattered electron detector, i.e., depending on the shape and vertical position of the scintillator 8 of the scattered electron detector. Even where the shape and vertical position of the scintillator 8 of the scattered electron detector are re-designed to sufficiently obtain an S/N, the acceptation angular range 40 of the scattered electron detector is always fixed, and an angle distribution of the scattered electron differs according to the type of material contained in the specimen. It is therefore not possible to change the acceptance angular range 40 of the scattered electron detector and improve contrast at a place where one desires to observe. When the acceptance angular range 40 of the scattered electron detector is changed in reverse, the distance 46 of the object point from the energy loss spectrometer is changed and there is a need to re-adjust the alignment, focus, etc. of the energy loss spectrometer, thus causing cumbersomeness of operationality.

The foregoing points are defective points that occur where the conventional scanning transmission electron microscope is used. In summary, the mounting positions, sizes and shapes of the energy loss spectrometer and the scattered electron detector with respect to the electron microscope are restricted according to the design specification of the energy loss spectrometer, and the acceptance angle of the energy loss spectrometer and the acceptance angular range of the scattered electron detector are respectively set to one type alone. Therefore, there is a possibility that information about the shape, composition, combined or bonding state, etc. of a substance obtained using the electron microscope cannot be extracted sufficiently.

A description will next be made of acceptance angular ranges for a scattered electron image and an energy loss spectrum by use of the scanning transmission electron microscope of the present invention.

Figure 5:
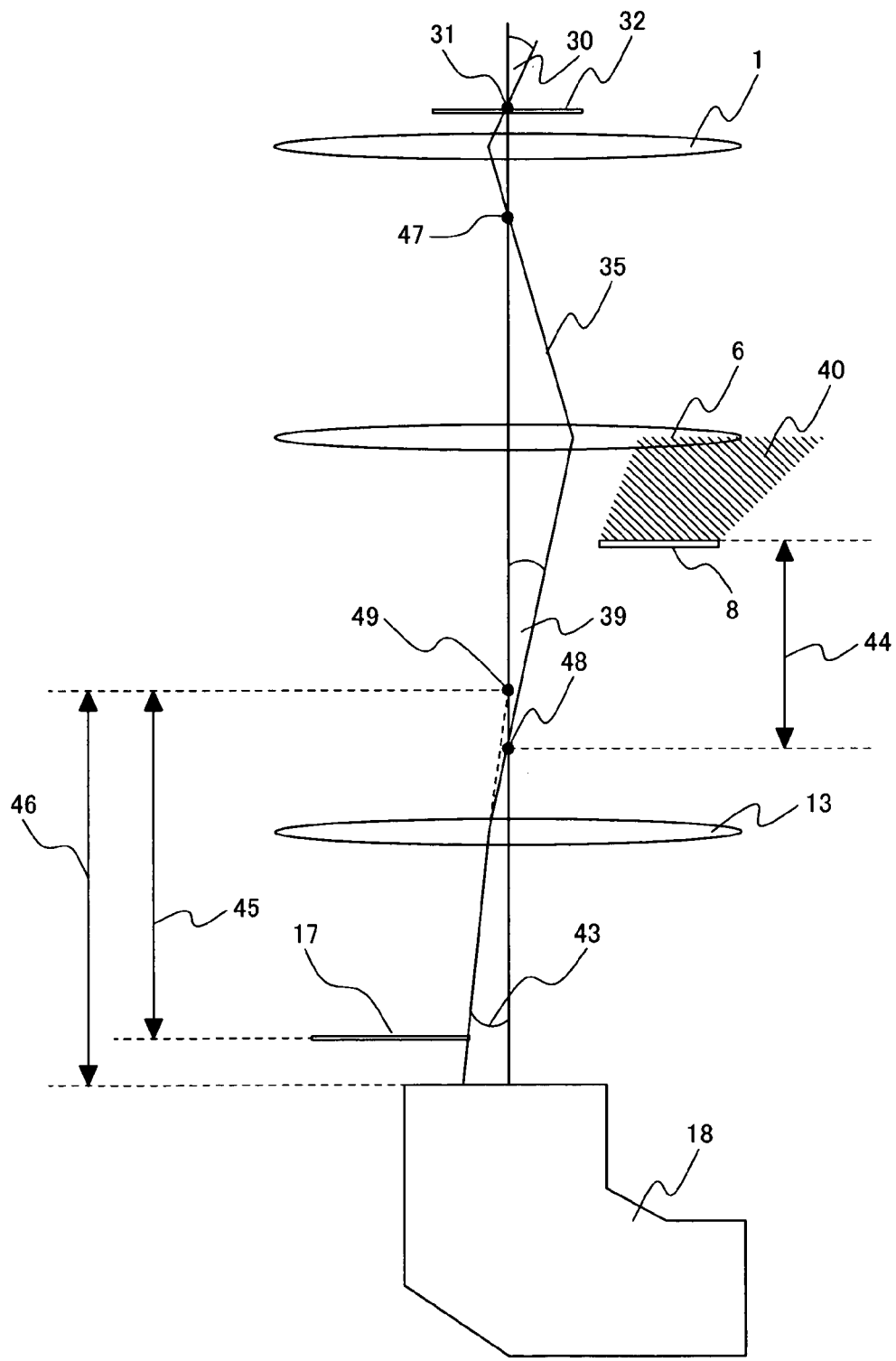
FIG. 5 is a diagram for describing a first configuration example about angular ranges for acceptance of an electron into a scattered electron detector and an energy loss spectrometer by a scanning transmission electron microscope of the present invention.

FIG. 5 shows a first configuration example about angular ranges for capturing of each electron or electron beam into a scattered electron detector and an energy loss spectrometer by a scanning transmission electron microscope of the present invention. The figure shows electron optical conditions where an image point 47 of an objective lens 1, an image point 48 of a first stage projector lens 6, an image point 49 of a second stage projector lens 13 are respectively sequentially formed by the objective lens 1, the first stage projector lens 6 and the second stage projector lens 13 placed between the scattered electron detector and a collection angle defining aperture 17 of the energy loss spectrometer. Consider where a distance 46 of an object point from the energy loss spectrometer and a physical angle 43 corresponding to the radius of the collection angle defining aperture of the energy loss spectrometer with respect to an image point of an imaging lens are set on the condition that a spectrum having a satisfactory energy resolution is obtained using the energy loss spectrometer 18. The acceptance angular range 40 of the scattered electron detector is decided by a distance 44 between the scattered electron detector and the image point of the imaging lens. The acceptance angular range 40 and the acceptance angular range of the energy loss spectrometer are respectively independently set by the distance 44 and a distance 45 between the collection angle defining aperture 17 of the energy loss spectrometer and the image point 49 of the second stage projector lens.

In the present example, all the incident electrons can be captured into the energy loss spectrometer by suitably selecting the image point 48 of the first stage projector lens and the image point 49 of the second stage projector lens. This optical condition indicates a given one of the conditions for the angles of acceptance of the electron into the scattered electron detector and the energy loss spectrometer. The present invention brings about an effect where the angular ranges for electron acceptance into the scattered electron detector and the energy loss spectrometer are changed from this optical condition.

Figure 6:
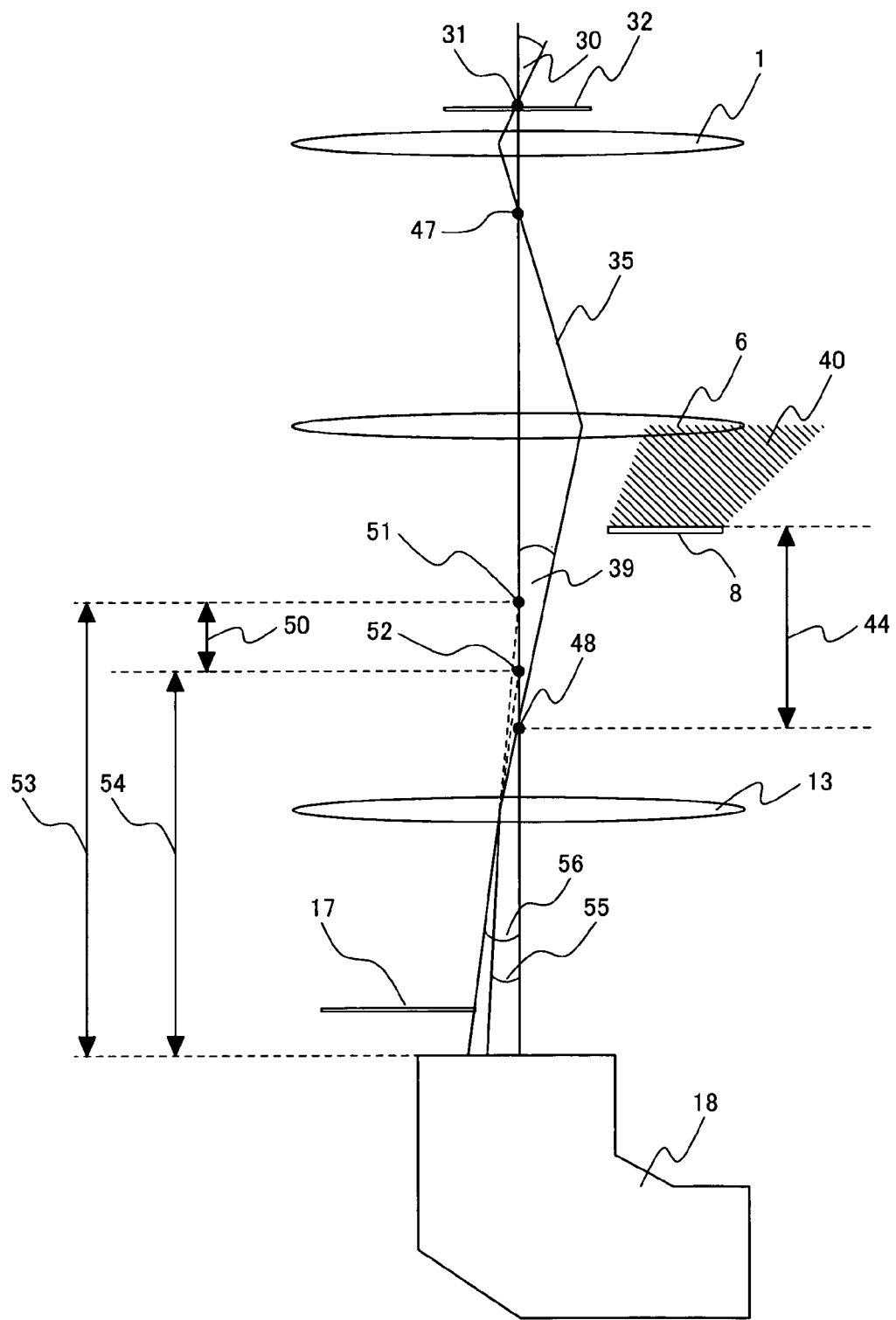
FIG. 6 is a diagram for describing a second configuration example about angular ranges for acceptance of an electron into a scattered electron detector and an energy loss spectrometer by a scanning transmission electron microscope of the present invention.

FIG. 6 shows a second configuration example about angular ranges for capturing of an electron or electron beam into a scattered electron detector and an energy loss spectrometer by a scanning transmission electron microscope of the present invention. The figure shows a case in which an excitation condition for a second stage projector lens is changed from the optical condition shown in FIG. 5. While a suitable object-point position for acquiring a spectrum having a satisfactory energy resolution exists in the energy loss spectrometer, an allowable range 50 of an object point of the energy loss spectrometer often exists in this position. Using it makes it possible to change physical information contained in the spectrum without changing the condition under which the energy resolution of the spectrum is satisfactory.

The present example shows a case in which an image point 48 of a first stage projector lens 6 is formed to determine the acceptance angular range of the scattered electron detector, and an image point 51 of a second stage projector lens 13 corresponding to an upper limit 53 of an allowable range of an object point for the energy loss spectrometer is formed independent of the above image point, and a case in which an image point 52 of the second stage projector lens 13 corresponding to a lower limit 54 of the variable range of the object point for the energy loss spectrometer is formed. Although there is a need to change alignment and focus conditions for the energy loss spectrometer in the former and latter, it is possible to change a physical angle 55 of an axial ray with respect to the upper limit of the allowable range of the object point for the energy loss spectrometer and a physical angle 56 of the axial ray with respect to the lower limit of the variable range of the object point for the energy loss spectrometer. In the latter, all the incident electrons can be captured into the energy loss spectrometer in a manner similar to the first configuration example shown in FIG. 5, whereas in the former, all the incident electrons and part of a scattered electron can be captured therein. The scattered electron is equivalent to one obtained by causing the incident electron to change in phase by a specimen 32. Different information is contained in spectrums acquired under the conditions for the former and latter. Comparing both spectrums enables extraction of an energy loss spectrum from the electron that has produced the change in phase.

In the case of elements large in atomic number, which generate scattered electrons in large numbers, information such as an improvement in S/N of spectrums, their combined or bonding states, etc. can be extracted with a high degree of efficiency by causing information about the scattered electrons to be contained in the spectrums.

Effects of the present example will be summarized as follows. They reside in that the information contained in the energy loss spectrum can be changed without changing the acceptance angular range of the scattered electron detector, i.e., changing the conditions under which the S/N of the scattered electron image or its contrast has been optimized, or the S/N of the spectrum can be improved.

Figure 7:
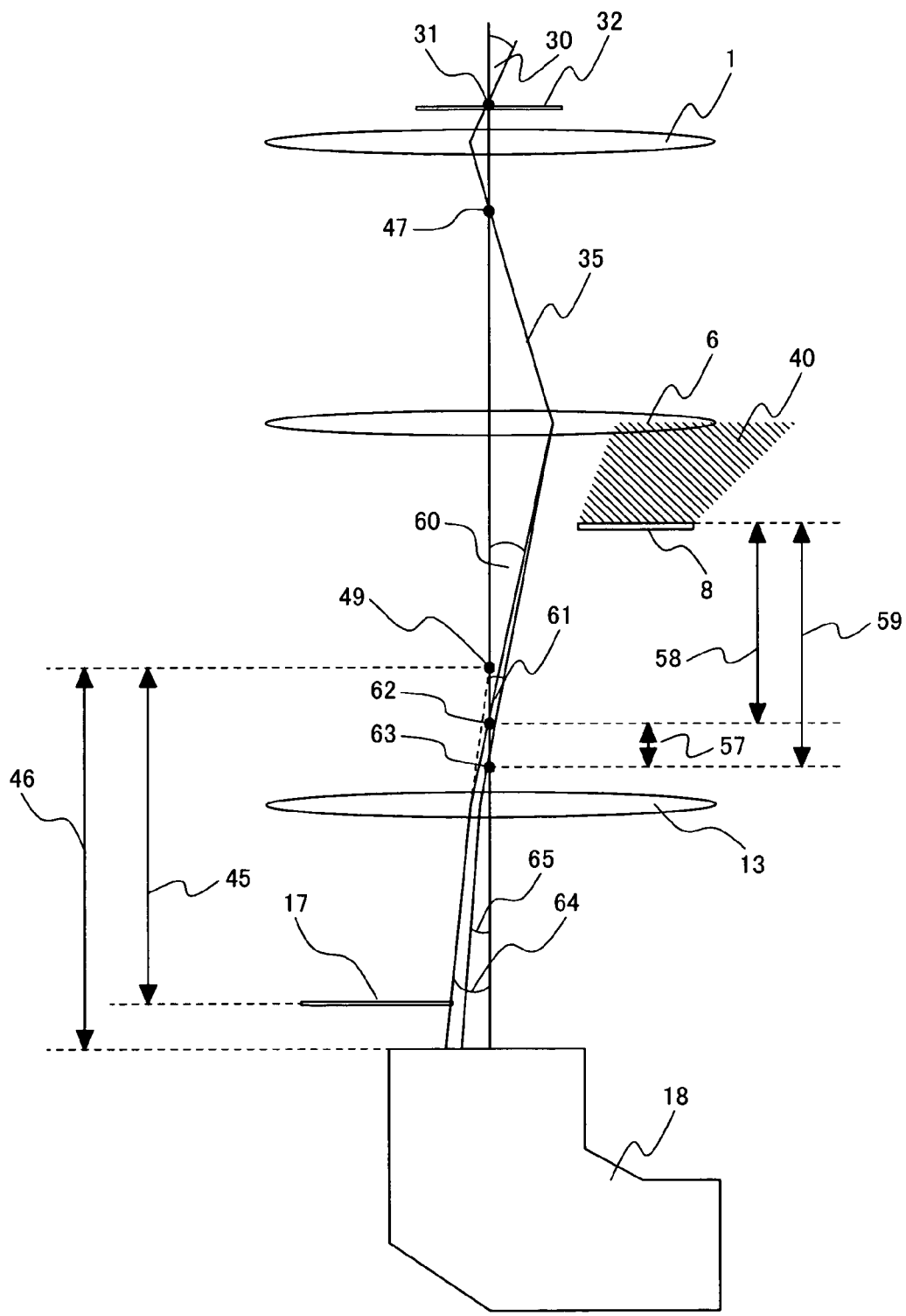
FIG. 7 is a diagram for describing a third configuration example about angular ranges for acceptance of an electron into a scattered electron detector and an energy loss spectrometer by a scanning transmission electron microscope of the present invention.

FIG. 7 shows a third configuration example about angular ranges for capturing of an electron or electron beam into a scattered electron detector and an energy loss spectrometer by a scanning transmission electron microscope of the present invention. The figure shows a case in which excitation conditions for first and second stage projector lenses are changed from the optical condition shown in FIG. 5. It is assumed that a distance 46 of an object point from the energy loss spectrometer, for acquiring a spectrum having a satisfactory energy resolution is set. Combinations of the excitation conditions of the first stage projector lens 6 and the second stage projector lens 13 for forming the distance 46 of the object point from the energy loss spectrometer exist in countless numbers. Since, however, the second stage projector lens corresponds to a rotationally symmetric lens, an allowable range 57 of an image point of the first stage projector lens is actually restricted. Under this condition, an upper limit 58 of an allowable range of the distance between the image point of the first stage projector lens and the scattered electron detector with respect to an upper limit 62 of the allowable range of the image point of the first stage projector lens, and an emerging angle 60 of the first stage projector lens with respect to the upper limit of the allowable range of the image point of the first stage projector lens are decided. Further, a lower limit 59 of the allowable range of the distance between the image point of the first stage projector lens and the scattered electron detector with respect to a lower limit 63 of the allowable range of the image point of the first stage projector lens, and an emerging angle 61 of the first stage projector lens with respect to the lower limit of the allowable range of the image point of the first stage projector lens are determined under this condition.

As to a condition for the second stage projector lens 13, the upper limit 62 of the allowable range of the image point of the first stage projector lens, and the lower limit 63 of the allowable range of the image point of the first stage projector lens can definitely be decided in 1:1 depending on the condition for the first stage projector lens as a condition for projecting them on the distance 46 of the object point from the energy loss spectrometer. When the condition for the first stage projector lens is set to the upper limit 62 of the allowable range of the image point of the first stage projector lens, a physical angle 64 of an axial ray with respect to an image point 49 of the second stage projector lens which object point is the upper limit 62 of the allowable range of the image point of the first stage projector lens coincides with the acceptance physical angle of the energy loss spectrometer in a manner similar to the first configuration example shown in FIG. 5. On the other hand, when the condition for the first stage projector lens 6 is set to the lower limit 63 of the allowable range of the image point of the first stage projector lens, a physical angle 65 of the axial ray with respect to the image point 49 of the second stage projector lens which object point is the lower limit of the allowable range of the image point of the first stage projector lens becomes smaller than the acceptance physical angle of the energy loss spectrometer, so that the scattered electrons can also be captured into the energy loss spectrometer 18 together with the axial ray.

A first advantageous effect obtained where the imaging condition is changed using the present example, resides in that even though the acceptance angular range of the scattered electron detector is changed, the position of the object point of the energy loss spectrometer remains unchanged. That is, energy loss spectrums identical in energy resolution can be acquired while changing information contained in a scattered electron image. Since this operation needs not to change alignment and focus conditions for the energy loss spectrometer, the influence of instability produced where the condition of the energy loss spectrometer given to the corresponding spectrum is changed, can be avoided. It is known that the scattered electron image is closely related to an atomic number and the contrast of a portion that one desires to observe can be improved when the acceptance angular range of the scattered electron detector is changed. It is essential to the best use of the scanning transmission electron microscope, that the operation of varying the acceptance angle range of the scattered electron detector does not exert an influence on the energy resolution of each energy loss spectrum.

A second advantageous effect is as follows. When a place where an axial ray 35 is small with respect to changes in the emerging angle 60 of the first stage projector lens with respect to the upper limit 62 of the allowable range of the image point of the first stage projector lens, and the emerging angle 61 of the first stage projector lens with respect to the lower limit 63 of the allowable range of the image point of the first stage projector lens, i.e., the scintillator 8 of the scattered electron detector approaches the first stage projector lens 6, a change in the acceptance angular range of the scattered electron detector by the first stage projector lens 6 becomes small. Therefore, when the mounting of such a scattered electron detector is implemented, no change in information contained in the scattered electron image occurs and no change in energy resolution of the energy loss spectrum occurs either, thus enabling an improvement in the S/N of the energy loss spectrum. A material containing light elements in large numbers presents a problem about damage of a specimen by electron irradiation and has the potential for a change in combined or bonding state even during an analysis. A method for decreasing the amount of an incident electron and reducing the specimen damage is effective for such a material. The specimen containing the light elements in large numbers is insensitive to the change in scattered electron image with respect to the acceptance angular range of the scattered electron detector. Thus, if the mounting position of the scattered electron detector is caused to approach the first stage projector lens 6 and the optical condition shown in the present example is applied, thereby to improve the S/N of the energy loss spectrum, then an analysis time can be shortened and an analysis reduced in specimen damage can be carried out. Since there is no need to change the condition of the energy loss spectrometer under the optical condition shown in the present example, an improvement in S/N of the energy loss spectrum can be made by the operation of a user without concern for a reduction in energy resolution. Further, information contained in the energy loss spectrum can be changed by capturing of the scattered electron image into the energy loss spectrometer in a manner similar to the second configuration example of the present invention.

The above advantageous effects of the third configuration example will be summarized as follows. They reside in that even though the acceptance angular range of the scattered electron detector is changed, the condition for the energy loss spectrometer is not modified and the energy resolution of the energy loss spectrum remains unchanged, and the S/N of the energy loss spectrum can be improved on condition that the energy resolution of the energy loss spectrum remains unchanged, without modifying the condition for the energy loss spectrometer.

Figure 8:
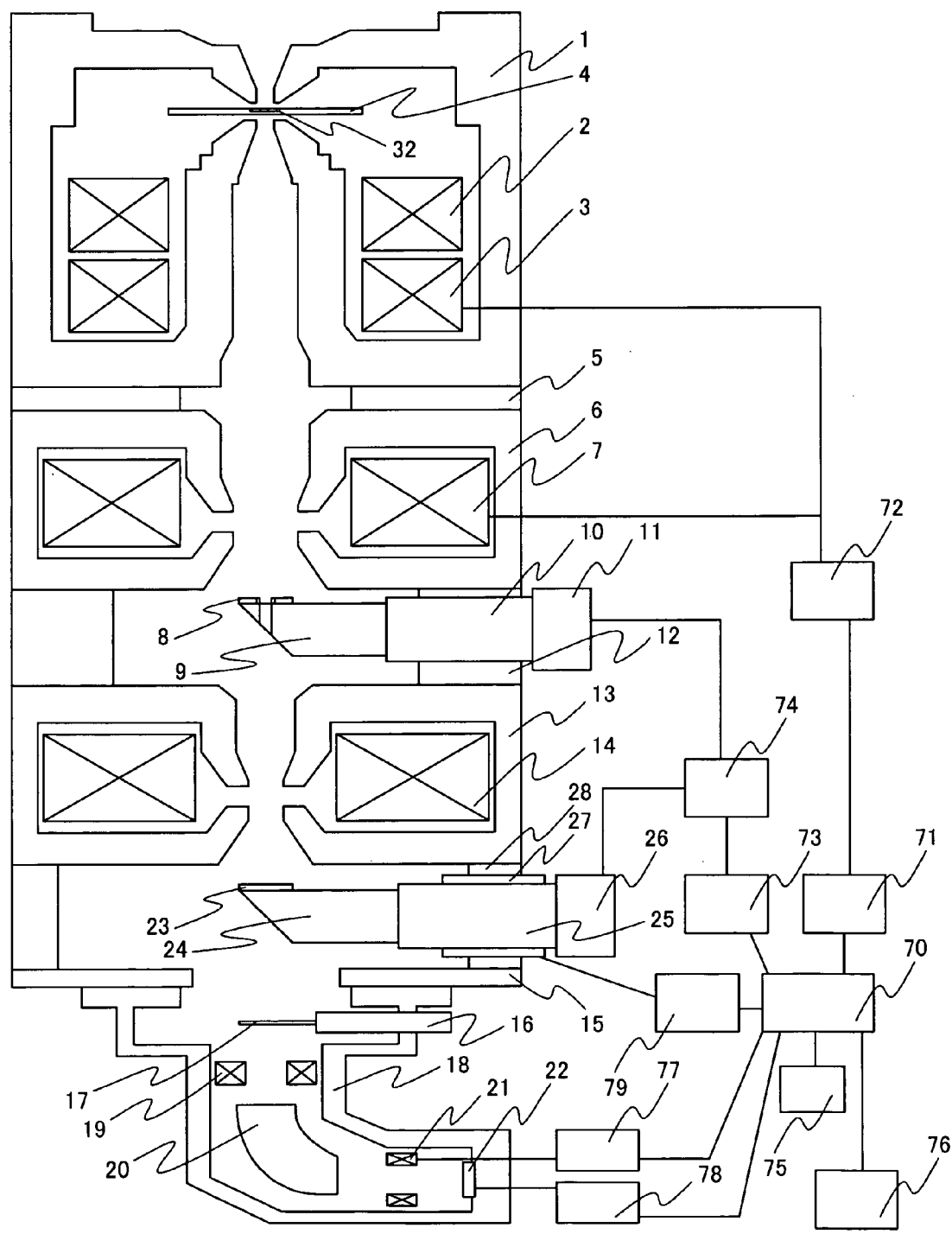
FIG. 8 is a diagram for describing a scanning transmission electron microscope of the present invention and a configuration of a control circuit thereof.

FIG. 8 is a diagram showing a configuration of a control circuit of a scanning transmission electron microscope of the present invention. A control CPU 70 controls the supply of currents or voltages to a deflection coil, a magnetic field type rotationally symmetric lens and an energy loss spectrometer lens constituting the scanning transmission electron microscope, the detection and display of a scan transmitted image and an energy loss spectrum, and loading and unloading of a transmitted electron detector from an optical axis, and performs control for detecting an input given from an operator and reflecting operator's intention on the apparatus. The control on the magnetic field type rotationally symmetric lens is of a system for causing the CPU 70 to control a DC current outputted from a coil current output circuit 72 to a lens coil via a DA converter 71. It is thus possible to change a focal length to thereby decide focusing on a specimen 4, a detecting angular range of a scattered electron detector and the position of an object point of an energy loss spectrometer 18.

The detection of an image signal is based on a control system for amplifying voltage signals amplified by an amplifier 11 of the scattered electron detector and an amplifier 26 of the transmitted electron detector by an image signal output circuit 74, effecting addition and subtraction on DC components, and causing the control CPU 70 to display an image through an AD converter 73. Capturing of the scan transmitted image is carried out by performing control for supplying a two-dimensional scanning signal from the coil current output circuit 72 to a scanning coil to thereby scan electrons on the specimen 4 and detecting a detection signal by the image signal output circuit 74 in synchronization with the control. Digitization by the AD converter 73 is controlled such that, for example, a dynamic range of one pixel is converted into a 16-bit digital signal and controlled such that the digital converted value is displayed on a displaying apparatus 75 as a two-dimensional image corresponding to each scanning point.

Control on the energy loss spectrometer is a system that forms such an optical condition that a circuit 77 of controlling a signal for an energy loss spectrometer lens current output supplies a current or voltage to a multi-pole lens 19 for forming a spectrum, a magnetic prism 20 of the energy loss spectrometer for forming an energy dispersion, and a multi-pole lens 21 of the energy loss spectrometer for magnifying the energy dispersion to thereby make it possible to acquire a desired energy loss spectrum. The formed energy loss spectrum is converted by a circuit 78 of detecting energy loss spectrum into such a format that the control CPU 70 is capable of displaying the spectrum with the dynamic range as the 16-bit digital signal with respect to one energy value.

There is a need to withdraw the transmitted electron detector from the optical axis upon capturing of the energy loss spectrum. However, the present control is carried out by supplying a signal from the control CPU 70 to a circuit 79 of drive mechanics 27 for the transmitted electron detector, supplying compressed air and thereby driving the drive mechanics 27 for the transmitted electron detector. Also the driving of the present withdrawal mechanics can be carried out even by such a system that the control CPU 70 controls the supply of a voltage to a motor mounted to the drive mechanics 27 for the transmitted electron detector.

An operator is capable of carrying out all the controls referred to above via an input apparatus 76. The input apparatus comprises a keyboard, a mouse and a volume control or button for a computer.

A method for controlling acceptance angles for the scattered electron detector and the energy loss spectrometer employed in the present invention will next be explained.

A first stage projector lens 6 and a second stage projector lens 13 are both magnetic field type rotationally symmetric lenses. Their focal lengths are controlled by excitation currents. Since a detecting angle 40 of the scattered electron detector is determined when the focal length of the first stage projector lens 6 is decided, the operator is able to select the excitation current for the first stage projector lens 6. Alternatively, detecting angles have been displayed, and when the corresponding detecting angle is selected, an excitation current corresponding to it is supplied. The detecting angles are made by such a control system that, for example, excitation currents are prepared as a table so as to be capable of being selected every 1 mrad within a given range, and a body control program refers to the table. Alternatively, when the operator controls a control or button that enables the excitation current of the first stage projector lens 6 to vary or inputs a numerical value, the corresponding detecting angle is displayed on the displaying apparatus 75 by table reference or extrapolation.

A control system for the second stage projector lens 13 is capable of selecting various detection modes according to a combination with the first stage projector lens 6. The first configuration example shown in FIG. 5 is placed in an energy loss spectrum acquisition mode for an arbitrary detecting angle. In the present mode, the acceptance angular range of the energy loss spectrometer can be selected, and the excitation current for the second stage projector lens 13, corresponding to the selected angular range is automatically set and supplied to the corresponding apparatus. The present control system can be carried out by allowing a body control program to refer to a control table. Alternatively, it can be carried out by such a control method that the excitation current for the second stage projector lens 13 is calculated with respect to an operator's arbitrary input value. When a range out of a variable range is selected, a warning is displayed, and a safeguard is effected in such a manner that the body control program does not hang up.

Since the position of the object point of the energy loss spectrometer is changed by the setting of the operator in the present mode, the setting of the energy loss spectrometer is also linked by the body control program so as to be automatically changed by either a table formula or a computational equation simultaneously with the selection of the acceptance angular range. Detailed adjustments to an energy loss spectrum such as to the focus of the spectrum, etc. are also automatically made after a change in setting, and hence the work of re-adjusting the energy loss spectrometer by the operator with the change in setting does not occur.

Further, the second configuration example shown in FIG. 6 is placed in a scan transmitted image acquisition mode for an arbitrary detecting angle. As described above, the operator is capable of arbitrarily selecting a detecting angle of a scattered electron image that the operator desires to acquire. The setting of the second stage projector lens 13 is automatic and automatically changed by either a table formula or a computational equation in such a manner that a change in object point of the energy loss spectrometer due to the above operation does not occur. Detailed adjustments to an energy loss spectrum such as to the focus of the spectrum, etc. are also automatically carried out in a manner similar to the first embodiment.

Further, the third configuration example shown in FIG. 7 is placed in a mode in which a scanning transmitted image and an energy spectrum in a more expert operator can be captured at an arbitrary detecting angle. In the present mode, excitation currents for the first stage projector lens 6 and the second stage projector lens 13 can arbitrarily be changed, and detecting angles for the scattered electron image and energy loss spectrum can perfectly be selected arbitrarily. However, both the scattered electron image and the energy loss spectrum are restricted by threshold values in such a manner than they can be changed within their variable ranges. Combinations that cause defective conditions such as the S/N of an image or spectrum being degraded depending upon combinations of the variable ranges of the first stage projector lens 6 and the second stage projector lens 13 even in the case of the variable ranges thereof, are set such that it cannot be selected in advance, or a warning is displayed.

Although the combinations are made possible infinitely in the present mode, there is considered a system in which in consideration of an operator's aim and the ease of use therefore, for example, preset tables with respect to light elements, heavy elements, a high resolution spectrum, etc. are prepared and detecting angles are controlled so as to be arbitrarily variable from these preset tables. A setting table for the energy loss spectrometer in this mode is calculated and automatically set by the body control program in such a manner that the optimum position of object point of the energy loss spectrometer is selected from the excitation currents of the first stage projector lens 6 and the second stage projector lens 13.

According to the present invention, as described in detail above, information contained in an energy loss spectrum can be changed without altering an acceptance angular range of a scattered electron detector. The S/N of the energy loss spectrum can be improved without changing the acceptance angular range of the scattered electron detector. When the acceptance angular range of the scattered electron detector is changed, there is no need to alter the condition for the energy loss spectrometer, a change in the energy resolution of the energy loss spectrum does not occur, and the S/N of the energy loss spectrum can be improved.

What is claimed is:

1. A scanning transmission electron microscope comprising:
an energy loss spectrometer;
a first rotationally symmetric type magnetic lens for setting an acceptance angle of an electron scattered by a specimen, said first rotationally symmetric type magnetic lens being disposed above a scattered electron detector for detecting the electron; and
a second rotationally symmetric type magnetic lens disposed between the scattered electron detector and the energy loss spectrometer,
wherein the first rotationally symmetric type magnetic lens sets the acceptance angle of the scattered electron, and
wherein the second rotationally symmetric type magnetic lens sets an object point of the energy loss spectrometer.

2. A scanning transmission electron microscope utilized in combination with an energy loss spectrometer, comprising:
a specimen table for holding a specimen;
an illumination optical system for scanning a converged electron on the specimen;
a scattered electron detector for detecting an electron scattered by the specimen;
an objective lens disposed between the specimen table and the scattered electron detector;
a diaphragm having an aperture for capturing an electron transmitted through the specimen and having passed through the scattered electron detector into the energy loss spectrometer;
a first rotationally symmetric type magnetic lens of at least one stage disposed in a stage above the scattered electron detector; and
a second rotationally symmetric type magnetic lens of at least one stage disposed in a stage below the scattered electron detector,
wherein angular ranges for all or some of electrons transmitted through the scattered electron detector are selectively captured into the energy loss spectrometer independent of an angular range for the electron captured into the scattered electron detector.

3. The scanning transmission electron microscope according to claim 2, wherein the objective lens and the diaphragm are disposed in such a manner that an angle $\alpha$ of incidence of the converged electron into the objective lens and an acceptance angle $\beta$ of an electron incident into the diaphragm satisfy $\beta \geq \alpha/M$ (where M indicates a magnification based on an integrated lens action of the objective lens, the first rotationally symmetric type magnetic lens and the second rotationally symmetric type magnetic lens).

4. A scanning transmission electron microscope utilized in combination with an energy loss spectrometer, comprising:
a specimen table for holding a specimen;
an illumination optical system for scanning a converged electron on the specimen;
a scattered electron detector for detecting a scanning electron scattered by the specimen;
an objective lens disposed between the specimen table and the scattered electron detector;

a diaphragm provided with an aperture for capturing a scanning electron transmitted through the specimen into the energy loss spectrometer;

a first projector lens disposed between the objective lens and the scattered electron detector; and a second projector lens disposed between the scattered electron detector and the diaphragm, wherein a first image obtained through the objective lens, of the electron transmitted through the specimen is projected onto a second image by the first projector lens, and the second image is projected onto a third image by the second projector lens.

5. The scanning transmission electron microscope according to claim 4, wherein the first image obtained through the objective lens, of the electron transmitted through the specimen is projected onto a second image by the first projector lens, the second image is projected onto a third image by the second projector lens, and the third image coincides with an object point of the energy loss spectrometer.

6. The scanning transmission electron microscope according to claim 4 or 5, further comprising a transmitted electron detector for detecting the electron transmitted through the specimen.

7. The scanning transmission electron microscope according to claim 6, wherein the scattered electron detector has an annular shape provided with an opening through which an optical axis of the electron transmitted through the specimen passes, and the transmitted electron detector is placed on the optical axis and disposed between the scattered electron detector and the diaphragm.

8. The scanning transmission electron microscope according to claim 4 or 5, further comprising first control means for reading a signal detected by the scattered electron detector in synchronization with a scanning cycle of the electron scanned on the specimen.

9. The scanning transmission electron microscope according to claim 4 or 5, wherein each of the first projector lens and the second projector lens is a rotationally symmetric type magnetic lens.

10. The scanning transmission electron microscope according to claim 8, further comprising:

display means for displaying the signal detected by the scattered electron detector as an image; and second control means for reading a signal detected by the transmitted electron detector in synchronization with a scanning cycle of the electron scanned on the specimen, wherein both a dark field image formed from the signal detected by the scattered electron detector and a bright field image formed from the signal detected by the transmitted electron detector are displayed on the display means.

11. The scanning transmission electron microscope according to claim 10, further comprising:

detector drive means for moving the transmitted electron detector, wherein the transmitted electron detector is withdrawn from on the optical axis upon execution of spectroscopy.

12. The scanning transmission electron microscope according to claim 11, further comprising:

mode switching input means for selecting a dark field image observation mode, a bright field image observation mode or a mode for simultaneously observing a dark field image and a bright field image; and third control means for controlling the detector drive means, wherein the third control means operates the detector drive means in accordance with an input to the mode switching input means and withdraws the transmitted electron detector from on the optical axis or moves the same onto the optical axis.

13. An electron energy loss spectroscopy using a scanning transmission electron microscope, comprising the steps of:

scanning an electron generated from an electron source on a specimen through an illumination optical system;

detecting the intensity of each electron scattered by the specimen by a scattered electron detector to acquire a dark field image;

detecting the intensity of each of the electrons having passed through the scattered electron detector by a transmitted electron detector to acquire a bright field image;

launching each electron having passed through the scattered electron detector into an energy loss spectrometer to acquire an energy loss spectrum;

selectively capturing angular ranges for all or some of the electrons having passed through the scattered electron detector into the energy loss spectrometer by a first projector lens disposed in a stage above the scattered electron detector and a second projector lens disposed in a stage below the scattered electron detector, independent of an angular range of each electron captured into the scattered electron detector, thereby performing energy loss spectroscopy.

14. The electron energy loss spectroscopy according to claim 13, further comprising the steps of forming a first image of the electron on the specimen by a post-magnetic field objective lens, projecting the first image on a second image by the first projector lens and projecting the second image on a third image by the second projector lens.

15. The electron energy loss spectroscopy according to claim 13, further comprising the steps of forming a first image of the electron on the specimen by a post-magnetic field objective lens, projecting the first image on a second image by the first projector lens, projecting the second image on a third image by the second projector lens, and allowing the third image to coincide with an object point of the energy loss spectrometer.

16. The electron energy loss spectroscopy according to claim 13, further comprising the step of changing an acceptance angle of the transmitted electron detector by the second projector lens independent of an acceptance angular range of the scattered electron detector.

* * * * *